United States Patent
Singh et al.

(10) Patent No.: US 7,885,623 B2
(45) Date of Patent: Feb. 8, 2011

(54) FREQUENCY TUNABLE ARRANGEMENT

(75) Inventors: Fateh M. Singh, Caen (FR); Vincent Fillatre, Thaon (FR); Abdelilah Faleh, Safi, MA (US)

(73) Assignee: NXP B.V., Eindhoven (NL)

( * ) Notice: Subject to any disclaimer, the term of this patent is extended or adjusted under 35 U.S.C. 154(b) by 731 days.

(21) Appl. No.: 11/629,157

(22) PCT Filed: May 25, 2005

(86) PCT No.: PCT/IB2005/051717

§ 371 (c)(1),
(2), (4) Date: Dec. 7, 2007

(87) PCT Pub. No.: WO2005/122397

PCT Pub. Date: Dec. 22, 2005

(65) Prior Publication Data

US 2008/0191810 A1    Aug. 14, 2008

(30) Foreign Application Priority Data

Jun. 8, 2004 (EP) ................... 4102591
Aug. 25, 2004 (EP) ................... 04300556

(51) Int. Cl.
H04B 1/16 (2006.01)
H03B 19/00 (2006.01)

(52) U.S. Cl. ............ 455/188.1; 455/150.1; 455/323; 331/74; 327/117

(58) Field of Classification Search ............ 331/74, 331/177 R; 327/115, 117; 455/188.1, 188.2, 455/191.1, 150.1, 179.1, 180.1, 180.2, 182.1, 455/190.1, 323
See application file for complete search history.

(56) References Cited

U.S. PATENT DOCUMENTS

| 4,179,670 | A | | 12/1979 | Kingsbury |
| 5,703,540 | A | | 12/1997 | Gazda et al. |
| 5,983,088 | A | | 11/1999 | Aschwanden |
| 6,002,926 | A | | 12/1999 | Shiraishi et al. |
| 6,151,488 | A | * | 11/2000 | Brekelmans ............ 455/150.1 |
| 6,181,212 | B1 | * | 1/2001 | Khoini-Poorfard et al. .... 331/16 |
| 6,901,248 | B1 | * | 5/2005 | Cowley ................ 455/313 |
| 7,272,375 | B2 | * | 9/2007 | Tuttle et al. ............. 455/333 |
| 2003/0119466 | A1 | | 6/2003 | Goldman |
| 2003/0122630 | A1 | | 7/2003 | Fallisgaard et al. |
| 2004/0090278 | A1 | | 5/2004 | Hamaguchi et al. |

FOREIGN PATENT DOCUMENTS

| EP | 0 093 A33 A2 | 11/1983 |
| WO | WO 96/21270 A1 | 7/1996 |
| WO | WO 02/27937 | 4/2002 |
| WO | WO 04/001975 A1 | 12/2003 |
| WO | WO 2004/036751 A2 | 4/2004 |

\* cited by examiner

*Primary Examiner*—Robert Pascal
*Assistant Examiner*—Ryan Johnson

(57) ABSTRACT

A frequency tunable arrangement (ICT) comprises a tunable oscillator circuit (TOC) that provides an oscillator signal (OS). A controllable frequency divider circuit (CDIV, DBT1, DBT2, DBT3, MUX) provides a frequency-divided signal (MO) on the basis of the oscillator signal. The frequency-divided signal has a frequency that is equal to the frequency of the oscillator signal divided by a division factor. The controllable frequency divider circuit provides any division factor among a set of division factors (4, 5, 6, 7, 8) in which for any division factor a ratio between that division factor and a lower division factor closest thereto, if existing, does not exceed 1.25.

10 Claims, 3 Drawing Sheets

| OS | CDIV | AQ | BQ | CQ | DQ |
|---|---|---|---|---|---|
| 3.6-2.88 GHz | 4 | 900-720 MHz | 450-360 MHz | 225-180 MHz | 112-90 MHz |
| 3.6-2.88 GHz | 5 | 720-576 MHz | 360-288 MHz | 180-144 MHz | 90-72 MHz |
| 3.6-2.88 GHz | 6 | 600-480 MHz | 300-240 MHz | 150-120 MHz | 75-60 MHz |
| 3.6-2.88 GHz | 7 | 514-412 MHz | 257-206 MHz | 128-103 MHz | 64-52 MHz |

FREQUENCY TUNABLE ARRANGEMENT

FIELD OF THE INVENTION

An aspect of the invention relates to a frequency tunable arrangement. The frequency tunable arrangement may be, for example, an integrated circuit tuner for selecting a radio frequency signal that conveys information in the form of audio, video, or data or any combination of those. Other aspects of the invention relate to a method of tuning such a frequency tunable arrangement, a signal processing arrangement, a computer program product for a signal processing arrangement, and an information-rendering apparatus. The information-rendering apparatus may be, for example, a video display set.

BACKGROUND OF THE INVENTION

U.S. Pat. No. 5,983,088 describes a tuner that includes a local oscillator and a mixer for converting an RF signal to an IF signal. The local oscillator has only one tunable oscillating portion for generating an oscillator signal. A controllable frequency divider divides the frequency of the oscillator signal so that the receiver is able to tune through the UHF and VHF bands. The controllable frequency divider is controlled to divide by 1, 2, 4, 8, or 16.

SUMMARY OF THE INVENTION

The invention is defined by the independent claims. The dependent claims define advantageous embodiments.

According to an aspect of the invention, a frequency tunable arrangement has the following characteristics. The frequency tunable arrangement comprises a tunable oscillator circuit that provides an oscillator signal. A controllable frequency divider circuit provides a frequency-divided signal on the basis of the oscillator signal. The frequency-divided signal has a frequency that is equal to the frequency of the oscillator signal divided by a division factor. The controllable frequency divider circuit provides any division factor among a set of division factors in which for any division factor it holds that the ratio between that division factor and a lower division factor closest thereto, if existing, does not exceed 1.25.

The invention takes the following aspects into consideration. There are various oscillator characteristics other than tuning range that are of interest. For example, phase noise is an oscillator characteristic that is of interest. In a receiver, the phase noise of a tuning oscillator determines reception quality. In general, the phase noise of an oscillator is proportional to the tuning range of the oscillator in terms of minimum and maximum oscillator frequency. The greater the ratio between the maximum and the minimum oscillator frequency is, the more significant the phase noise will be.

The phase noise of an oscillator also depends on the elements that substantially determine the frequency of the oscillator. These frequency-determining elements may comprise, for example, an inductance and a capacitance. The lesser signal power the frequency-determining elements absorb, the lower the phase noise will be. Consequently, high-quality frequency-determining elements, which absorb relatively little signal power, allow a low phase noise oscillator that can be tuned throughout a relatively wide frequency range. For example, in the aforementioned prior-art tuner, the local oscillator may have sufficiently low phase noise if relatively high-quality frequency-determining elements are used. In practice, the prior-art tuner will require a discrete inductance having a relatively high-quality factor.

In accordance with the aforementioned aspect of the invention, the controllable frequency divider circuit provides any division factor among a set of division factors in which for any division factor the ratio between that division factor and the lower division factor closest thereto, if existing, does not exceed 1.25.

The invention allows tuning throughout a relatively wide frequency range with the tunable oscillator having a tuning range that is only 1.25, or even lower, in terms of ratio between maximum oscillator frequency and minimum oscillator frequency. Since the tuning range of the tunable oscillator can be relatively small, satisfactory phase noise can be achieved with frequency-determining elements of relatively modest quality. Such frequency-determining elements are relatively cheap. A reduction in cost associated with the frequency-determining elements will generally outweigh an increase in cost associated with the controllable frequency divider circuit, which may be somewhat more complex compared with the frequency divider circuit in the prior-art tuner. For these reasons, the invention allows cost reduction.

For example, in a television-tuner application, the invention allows frequency-determining elements in the form of an inductance and a capacitance that form part of an integrated circuit substrate. Contrary to the prior-art tuner, the inductance need not be in the form of an external component in order to achieve satisfactory phase noise. This represents an appreciable cost reduction.

These and other aspects of the invention will be described in greater detail hereinafter with reference to drawings.

DETAILED DESCRIPTION

Figure 1:
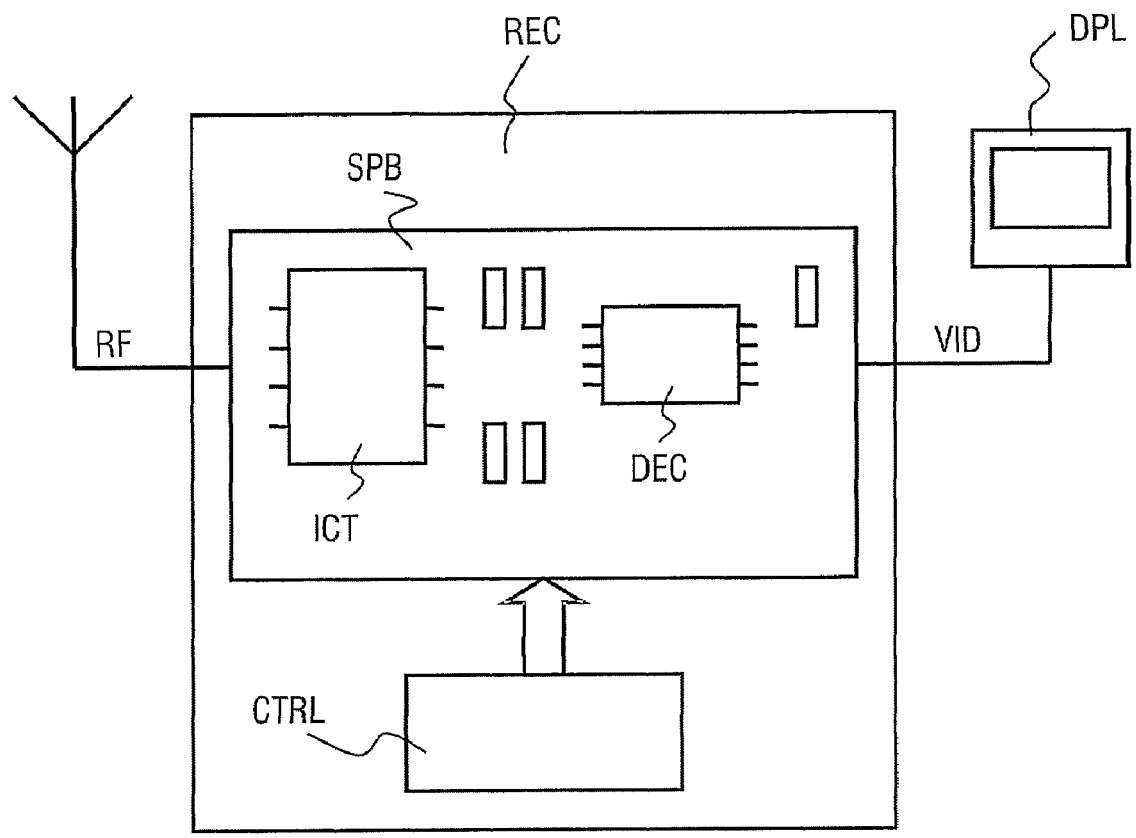
FIG. 1 is a block diagram that illustrates a video display set.

FIG. 1 illustrates a video display set VDS that comprises a receiver REC and a display device DPL. The receiver REC receives a radio frequency spectrum RF and retrieves a video signal VID from a desired signal within the radio frequency spectrum RF. The display device DPL displays the video signal VID.

The receiver REC comprises a signal processing board SPB and a controller CTRL. The signal processing board SPB comprises various components among which an integrated circuit tuner ICT and a decoder DEC. The aforementioned elements form part of a signal processing chain that derives the video signal VID from the radio frequency spectrum RF received. The controller CTRL controls this signal processing chain. For example, the controller CTRL controls the integrated circuit tuner ICT so that the integrated circuit tuner ICT selects a desired channel within the radio frequency spectrum RF.

Figure 2:
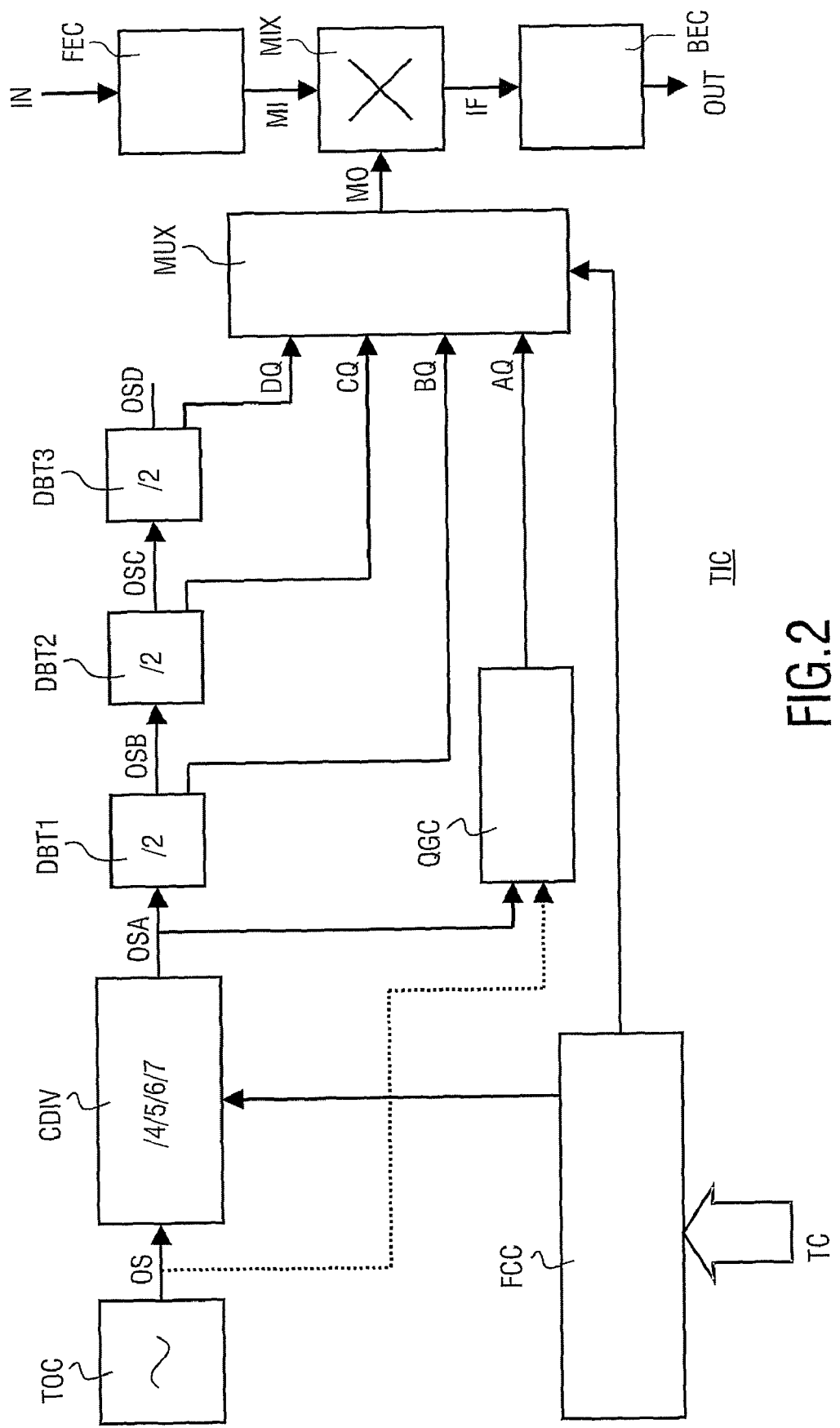
FIG. 2 is a block diagram that illustrated an integrated circuit tuner that forms part of the video display set.

FIG. 2 illustrates the integrated circuit tuner ICT. The integrated circuit tuner ICT comprises a front-end circuit FEC, a mixer circuit MIX, and a back-end circuit BEC, which appear in a right-hand portion of FIG. 2. The front-end circuit FEC receives an input signal IN which is, for example, a wideband-filtered version of the radio frequency spectrum RF. The front-end circuit FEC amplifies the input signal IN so as to obtain a mixer input signal MI. Preferably, the front-end circuit FEC has a variable gain so that the mixer input signal MI is at an appropriate level. The mixer circuit MIX mixes the mixer input signal MI with a mixer oscillator signal MO. Accordingly, an intermediate frequency signal IF is obtained. The back-end circuit BEC processed this intermediate frequency signal IF. The processing may include, for example, filtering and amplification preferably with a variable gain. Accordingly, an output signal OUT is obtained, which can be applied to the decoder DEC illustrated in FIG. 1.

The mixer oscillator signal MO is preferably a so-called quadrature signal, which has and in-phase component and a quadrature component. The mixer circuit MIX preferably mixes the mixer input signal MI with the in-phase component and the quadrature component. The mixer circuit MIX suppresses signals at so-called image frequencies. This alleviates filter requirements in the signal path that extends from the radio-frequency spectrum RFF, which is illustrated in FIG. 1, to the mixer input signal MI.

The integrated circuit tuner ICT further comprises an assembly of elements that provides the mixer oscillator signal MO. The assembly of elements includes a tunable oscillator circuit TOC, a controllable divider CDIV, three divide-by-two circuits DBT1, DBT2, DBT3, a multiplexer MUX, a quadrature generation circuit QGC, and a frequency control circuit FCC. The frequency control circuit FCC receives a tuning command TC from the controller CTRL illustrated in FIG. 1. In response to the tuning command TC, the frequency control circuit FCC applies appropriate control signals to the tunable oscillator circuit TOC, the controllable divider CDIV, and the multiplexer MUX.

The tunable oscillator circuit TOC provides an oscillator signal OS having a frequency that is tunable throughout a relatively small frequency range. The frequency control circuit FCC determines the frequency of the oscillator signal OS. The controllable divider CDIV divides the frequency of the oscillator signal OS. Accordingly, a divided oscillator signal OSA is obtained. The controllable divider CDIV can divide the oscillator frequency by 4, 5, 6, or 7. That is, the controllable divider CDIV provides a division factor that may be 4, 5, 6, or 7. The frequency control circuit FCC determines the division factor. The controllable divider CDIV is preferably arranged so that the divided oscillator signal OSA has a 50% duty cycle.

The three divide-by-two dividers DBT1, DBT2, DBT3 form a frequency division chain that provides a twice-divided oscillator signal OSB, a three-times-divided oscillator signal OSC, and a four-times-divided oscillator signal OSD. Divide-by-two divider DBT1 divides by two the frequency of the divided oscillator signal OSA. Accordingly, the twice-divided oscillator signal OSB has a frequency that is half ($\frac{1}{2}$) the frequency of the divided oscillator signal OSA. Divide-by-two divider DBT2 divides by two the frequency of the twice-divided oscillator signal OSB. Accordingly, the three-times-divided oscillator signal OSC has a frequency which is one quarter ($\frac{1}{4}$) of the frequency of the divided oscillator signal OSA. Divide-by-two divider DBT3 divides by two the frequency of the three-times-divided oscillator signal OSC. Accordingly, the four-times-divided oscillator signal OSD has a frequency which is one eight ($\frac{1}{8}$) of the frequency of the divided oscillator signal OSA.

Each divide-by-two divider DBT1, DBT2, DBT3 is arranged to provide a quadrature output signal, which has an in-phase component and a quadrature component. Accordingly, divide-by-two divider DBT1 provides a quadrature output signal BQ that is a quadrature version of the twice frequency-divided oscillator signal OSB. Divide-by-two divider DBT2 provides a quadrature output signal CQ that is a quadrature version of the three-times-divided oscillator signal OSC. Divide-by-two divider DBT3 provides a quadrature output signal DQ that is a quadrature version of and the four-times-divided oscillator signal OSD.

There are various manners to implement a divide-by-two divider that is capable of providing quadrature signals. For example, the PCT application WO9621270 describes a divide-by-two circuit that provides quadrature signals with relatively great precision. It is advantageous if the divided oscillator signal OSA has 50% duty cycle as mentioned hereinbefore. In that case, the time interval between a rising edge and the following falling edge in the divided oscillator signal OSA is identical to the time interval between a falling edge and the following rising edge. The time interval corresponds to a 90° phase difference in the twice-divided oscillator signal OSB, whose frequency is half ($\frac{1}{2}$) the frequency of the divided oscillator signal OSA.

The quadrature generation circuit QGC converts the divided oscillator signal OSA into a quadrature output signal AQ, which has the same frequency as the divided oscillator signal OSA. The quadrature generation circuit QGC may comprise, for example, phase-shift networks and synchronization circuits. The oscillator signal OS may serve as a clock signal for the synchronization circuits. A dotted line in FIG. 2 symbolizes this option. The multiplexer MUX selects one of the four quadrature output signals AQ, BQ, CQ, or DQ that the multiplexer MUX receives. The selected quadrature output signal constitutes the mixer oscillator signal MO that is applied to the mixer circuit MIX. The frequency control circuit FCC controls the multiplexer MUX and determines which quadrature output signal is selected.

Figures 3, 4:
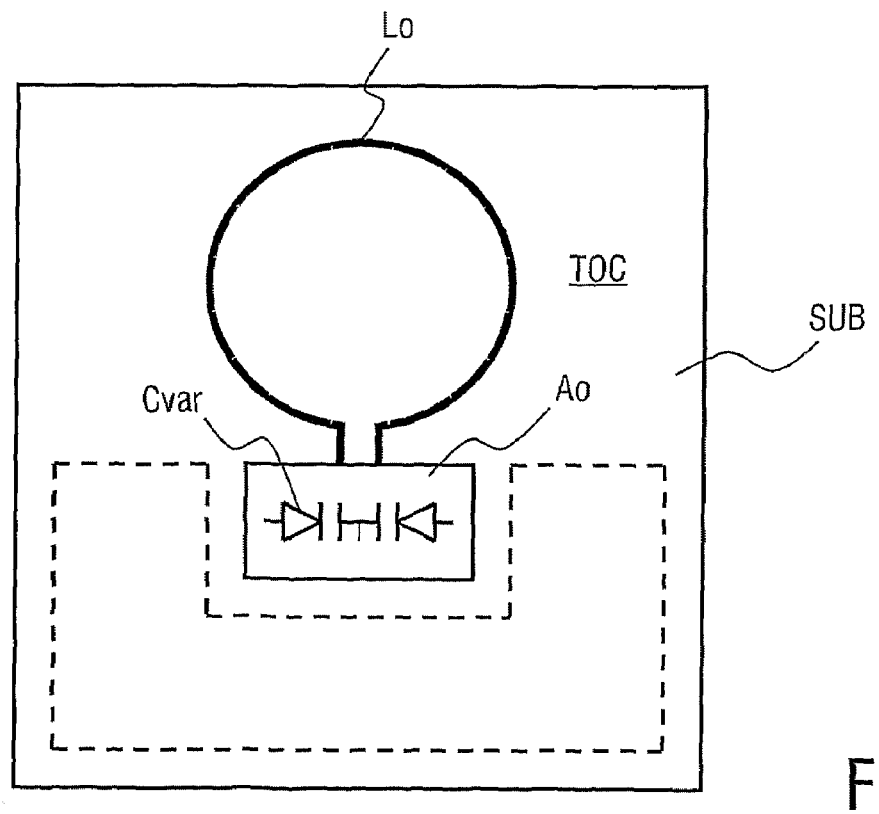
FIG. 3 is a table that illustrates division factors and signal frequencies within the integrated circuit tuner.
FIG. 4 is a top-view diagram that illustrates a tunable oscillator circuit that forms part of the integrated circuit tuner.

FIG. 3 illustrates respective frequencies of the quadrature output signals AQ, BQ, CQ, DQ, one of which is selected to constitute the mixer oscillator signal MO. FIG. 3 is a table with six columns. A column entitled "OS" specifies the frequency of the oscillator signal OS, which can be tuned throughout a frequency range between 3.6 and 2.88 GHz. A column entitled "CDIV" specifies the four division factors 4, 5, 6, and 7 of the controllable divider CDIV. Each division factor corresponds to a different row in the table. A column entitled "AQ" specifies the frequency of quadrature output signal AQ for each division factor: 4, 5, 6, or 7. Likewise, columns entitled "BQ", "CQ", and "DQ" specify the frequency of quadrature output signals BQ, CQ, and DQ, respectively, for each division factor: 4, 5, 6, or 7.

FIG. 3 demonstrates that the integrated circuit tuner ICT, which is illustrated in FIG. 2, can be tuned throughout various terrestrial television bands, namely the VHF1, VHF2, VHF3, and UHF band. There are three tuning parameters within the integrated circuit tuner ICT: selection of a quadrature output signal AQ, BQ, CQ, or DQ, selection of the division factor 4, 5, 6, or 7, and selection of the frequency of the oscillator signal OS within the frequency range between 3.6 and 2.88 GHz. The frequency control circuit FCC, which is illustrated in FIG. 2, carries out these selections in combination with the controller CTRL, which is illustrated in FIG. 1. More specifically, these elements carry out these selections by applying appropriate control signals applied to the multiplexer MUX, the controllable divider CDIV, and the tunable oscillator circuit TOC. The frequency control circuit FCC, or the controller CTRL, or both, may be in the form of, for example, a suitably programmed processor.

FIG. 4 illustrates the tunable oscillator circuit TOC. The tunable oscillator circuit TOC is formed on an integrated circuit substrate SUB by means of, for example, etching and deposition techniques. The tunable oscillator circuit TOC comprises an inductance Lo and an amplification circuit Ao. The amplification circuit Ao comprises a voltage dependent capacitance Cvar. For example, one or more reverse biased diodes may form the voltage dependent capacitance Cvar. The inductance Lo and the voltage dependent capacitance Cvar are frequency determining elements of the tunable oscillator circuit TOC. A conductive path in the form of a loop constitutes the inductance Lo as illustrated in FIG. 4. The conductive path may be formed, for example, in a conductive interconnection layer formed on the integrated circuit substrate SUB.

FIG. 4 thus illustrates that all elements of the tunable oscillator circuit TOC may be formed on the integrated circuit substrate SUB. Full integration has been achieved. The integrated circuit substrate SUB may comprise other elements of the integrated circuit tuner ICT illustrated in FIG. 2, which is symbolized by means of broken lines. The broken lines illustrate a surface in which these other elements may be formed on the integrated circuit substrate SUB.

Concluding Remarks

The detailed description hereinbefore with reference to the drawings illustrates the following characteristics. A frequency tunable arrangement (ICT) comprises a tunable oscillator circuit (TOC) that provides an oscillator signal (OS). A controllable frequency divider circuit provides a frequency-divided signal (mixer oscillator signal MO) on the basis of the oscillator signal (controllable divider CDIV, divide-by-two circuits DBT1, DBT2, DBT3, and multiplexer MUX, constitute a circuit assembly that provides mixer oscillator signal MO on the basis of oscillator signal OS). The frequency-divided signal (MO) has a frequency that is equal to the frequency of the oscillator signal (OS) divided by a division factor. The controllable frequency divider circuit provides any division factor among a set of division factors in which for any division factor the ratio between that division factor and the lower division factor closest thereto, if existing, does not exceed 1.25 (controllable divider CDIV, divide-by-two circuits DBT1, DBT2, DBT3, and multiplexer MUX provide the following division factors: 4, 5, 6, 7, 8, 10, 12, 14, 16, 20, 24, 28, 32, 40, 48, and 56; the lower division factor closest to division factor 5 is division factor 4, the ratio between these division factors, which is 1.25, does not does not exceed 1.25; the lower division factor closest to division factor 6 is division factor 5, the ratio between these division factors, which is 1.2, does not does not exceed 1.25; for any other division factor that may be considered, the ratio between that division factor and the lower division factor closest thereto does not exceed 1.25; division factor 4 is a special case because there is no lower division factor than 4).

The detailed description hereinbefore further illustrates the following optional characteristics.

The controllable frequency divider circuit (controllable divider CDIV, divide-by-two circuits DBT1, DBT2, DBT3, and multiplexer MUX) comprises a frequency divider subcircuit (controllable divider CDIV) arranged to provide any integer division factor among a set of integer division factors that ranges between $2^k$ and $2^{k+1}-1$, k being an integer greater than 1 (controllable divider CDIV provides division factors 4, 5, 6, and 7; $4=2^2$, $7=2^3-1$, so in this example k=2). An advantage of this characteristic is that the controllable frequency divider circuit can further comprise divide-by-two circuits, which are of relatively simple structure and which have relatively modest power consumption. Consequently, the aforementioned characteristic allows cost efficiency or power efficiency, or even both.

The tunable oscillator circuit (TOC) is formed on an integrated circuit substrate (SUB). This allows cost-efficient implementations and, moreover, avoids electro-magnetic interferences with other circuits.

The tunable oscillator circuit (TOC) comprises a resonance circuit (inductance Lo, voltage dependent capacitance Cvar) that includes an inductance (Lo). The inductance is formed on the integrated circuit substrate (SUB). This allows cost-efficient implementations with satisfactory phase noise properties.

The aforementioned characteristics can be implemented in numerous different manners. In order to illustrate this, some alternatives are briefly indicated. In another implementation, the set of division factors may be, for example: 8, 9, 10, 11, 12, 13, 14, 16, 18, 20, 22, 24, 26, 28, and 30. This can be achieved with a controllable divider that can provide integer division factor between 8 ($=2^3$) and 15 ($=2^4-1$) and a divide-by-two divider that can be "bypassed". There are numerous different manners to implement a controllable frequency divider circuit in accordance with the invention. For example, referring to FIG. 2, in an alternative embodiment, the multiplexer MUX may be omitted and each divide-by-two divider DBT can be switched between a divide-by-two mode and a non-divide mode: a "divide-by-one" mode. In such an alternative embodiment, the quadrature output signal DQ may directly constitute the mixer oscillator signal MO. In yet another alternative embodiment, the quadrature generation circuit QGC may be omitted. An additional divide-by-two divider having a quadrature signal output is inserted between the controllable frequency divider CDIV and divide-by-two circuit DBT1. In that case, the frequency of the tunable oscillator circuit TOC should be doubled in order to maintain tuning throughout UHF and VHF television bands. In yet another implementation, the mixer circuit MIX does not require a quadrature signal so that the controllable divider circuit need not include any special circuitry for generating quadrature signals.

There are numerous ways of implementing functions by means of items of hardware or software, or both. In this respect, the drawings are diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A frequency tunable arrangement comprising:
a tunable oscillator circuit arranged to provide an oscillator signal; and
a controllable frequency divider circuit for providing a frequency-divided signal on the basis of the oscillator signal, the frequency-divided signal having a frequency that is equal to the frequency of the oscillator signal divided by a division factor, the controllable frequency divider circuit being arranged to provide any division factor among a set of division factors in which for any division factor a ratio between that division factor and a lower division factor closest thereto, if existing, does not exceed 1.25, wherein the controllable frequency divider circuit comprises a frequency divider subcircuit arranged to provide any integer division factor among a set of integer division factors that ranges from $2^k$ to $2^{k+1}-1$, k being an integer greater than 1, wherein the controllable frequency divider circuit further comprises a divide-by-two divider circuit coupled to the frequency divider subcircuit, wherein the divide-by-two divider circuit is configured to switch between a divide-by-two mode and a non-divide mode.

2. A frequency tunable arrangement as claimed in claim 1, wherein the tunable oscillator circuit is formed on an integrated circuit substrate.

3. A frequency tunable arrangement as claimed in claim 2, wherein the tunable oscillator circuit comprises a resonance circuit that includes an inductance, the inductance being formed on the integrated circuit substrate.

4. A method of tuning a frequency tunable arrangement as defined in claim 1, the method comprising: a tuning step in which the frequency divider circuit is controlled so as to select a suitable division factor among the set of division factors.

5. A non-transient computer readable medium for a signal processing arrangement, the signal processing arrangement comprising a frequency tunable arrangement as claimed in claim 1 and a controller, the non-transient computer readable medium comprising a set of instructions that enables the controller to carry out: a tuning step in which the frequency divider circuit is controlled so as to select a suitable division factor among the set of division factors.

6. A signal processing arrangement that comprises a frequency-tunable arrangement as claimed in claim 1, a mixer circuit for mixing a mixer input signal with the frequency divided oscillator signal so as to obtain a mixer output signal and a processing circuit for processing the mixer output signal.

7. An information-rendering apparatus comprising a signal processing arrangement as claimed in claim 6, and an information-rendering device for rendering information that the processing circuit has derived from the mixer output signal.

8. A frequency tunable arrangement comprising:
a tunable oscillator circuit arranged to provide an oscillator signal; and
a controllable frequency divider circuit for providing a frequency-divided signal on the basis of the oscillator signal, the frequency-divided signal having a frequency that is equal to the frequency of the oscillator signal divided by a division factor, the controllable frequency divider circuit being arranged to provide any division factor among a set of division factors in which for any division factor a ratio between that division factor and a lower division factor closest thereto, if existing, does not exceed 1.25, wherein the controllable frequency divider circuit comprises a frequency divider subcircuit arranged to provide any integer division factor among a set of integer division factors that ranges from $2^k$ to $2^{k+1}-1$, k being an integer greater than 1, wherein the controllable frequency divider circuit further comprises a divide-by-two divider circuit coupled to the frequency divider subcircuit, wherein the controllable frequency divider circuit further comprises a multiplexer circuit coupled to the divide-by-two divider circuit; and
a quadrature generation circuit coupled to the frequency divider subcircuit and to the multiplexer circuit, wherein the quadrature generation circuit is configured to convert the frequency-divided signal into a quadrature output signal and to output the quadrature output signal to the multiplexer circuit.

9. A frequency tunable arrangement comprising:
a tunable oscillator circuit arranged to provide an oscillator signal; and
a controllable frequency divider circuit for providing a frequency-divided signal on the basis of the oscillator signal, the frequency-divided signal having a frequency that is equal to the frequency of the oscillator signal divided by a division factor, the controllable frequency divider circuit being arranged to provide any division factor among a set of division factors in which for any division factor a ratio between that division factor and a lower division factor closest thereto, if existing, does not exceed 1.25, wherein the controllable frequency divider circuit comprises a frequency divider subcircuit arranged to provide any integer division factor among a set of integer division factors that ranges from $2^k$ to $2^{k+1}-1$, k being an integer greater than 1, wherein the controllable frequency divider circuit further comprises:
three divide-by-two divider circuits coupled to the frequency divider subcircuit, wherein the three divide-by-two divider circuits are serially connected; and
a multiplexer circuit coupled to all of the three divide-by-two divider circuits.

10. A frequency tunable arrangement as claimed in claim 9 further comprising a quadrature generation circuit coupled to the frequency divider subcircuit and to the multiplexer circuit, wherein the quadrature generation circuit is configured to convert the frequency-divided signal into a quadrature output signal and to output the quadrature output signal to the multiplexer circuit.

* * * * *